(12) United States Patent
Park

(10) Patent No.: US 8,461,881 B2
(45) Date of Patent: Jun. 11, 2013

(54) HIGH POWER, HIGH SPEED SOLID STATE RELAY

(76) Inventor: Larry A. Park, Manning, OR (US)

(*) Notice: Subject to any disclaimer, the term of this patent is extended or adjusted under 35 U.S.C. 154(b) by 87 days.

(21) Appl. No.: 12/981,870

(22) Filed: Dec. 30, 2010

(65) Prior Publication Data

US 2011/0181344 A1 Jul. 28, 2011

Related U.S. Application Data

(60) Provisional application No. 61/298,704, filed on Jan. 27, 2010.

(51) Int. Cl.
*H03B 1/00* (2006.01)
*H03K 3/00* (2006.01)
(52) U.S. Cl.
USPC ............ 327/108; 327/109; 327/432; 327/434

(58) Field of Classification Search
USPC .................................. 327/108, 109, 432, 434
See application file for complete search history.

(56) References Cited

U.S. PATENT DOCUMENTS

| 4,408,137 A | 10/1983 | Fox | |
|---|---|---|---|
| 8,054,110 B2 * | 11/2011 | Wang et al. | 327/109 |
| 2007/0013356 A1 * | 1/2007 | Qiu et al. | 323/288 |

OTHER PUBLICATIONS

Jonathan Dodge, P.E., Eliminating Parasitic Oscillation between Parallel MOSFETs, Advanced Power Technology, Mar. 25, 2004, 6 pgs.

* cited by examiner

*Primary Examiner* — John Poos
(74) *Attorney, Agent, or Firm* — Chernoff Vilhauer McClung & Stenzel, LLP

(57) ABSTRACT

Electrically isolating the gate terminals of a pair of semiconductor output devices increases the switching speed of a solid state relay. A time delay enables tuning of the isolated gate circuits facilitating simultaneous operation of the output devices.

19 Claims, 3 Drawing Sheets

HIGH POWER, HIGH SPEED SOLID STATE RELAY

CROSS-REFERENCE TO RELATED APPLICATIONS

This application claims the benefit of U.S. Provisional App. No. 61/298,704, filed Jan. 27, 2010.

BACKGROUND OF THE INVENTION

The present invention relates to a solid state switch, and more particularly, to an electrically isolated solid state relay controllable by a low-voltage control signal and enabling rapid switching of high voltages and currents.

A solid state relay provides isolation between a control circuit and a switched circuit and may replace an electromechanical device such as a reed relay. A typical solid state relay comprises a light source such as a light-emitting diode (LED) optically coupled across an electrically isolating gap to a photovoltaic diode array. The photodiode array is electrically connected to a semiconductor output device such as a metal oxide semiconductor field effect transistor (MOSFET) which, in turn, is connected to enable or disable the flow of current in a circuit that is to be switched. Light from the LED creates a voltage across the photodiode stack and activates the output device. Alternatively, when light from the LED ceases, the voltage across the photodiode stack collapses and the output device is deactivated.

One limitation of solid state relays is the speed of the switching action. This is the result of a capacitance inherent in the output MOSFET. Each time the photodiode stack is actuated, this capacitance must be charged before the output MOSFET can turn on. Similarly, each time the photodiode stack is deactivated, this capacitance must discharge before the output MOSFET can turn off. The charging and discharging of this inherent capacitance inhibits the speed of the switching function. This problem is magnified when high-power circuits must be switched since larger MOSFETs with greater inherent capacitance must be used. Solid state relays are also susceptible to electrical transients.

U.S. Pat. No. 4,390,790 to Rodriguez discloses a relay that includes a photodiode stack directly connected to an output MOSFET. Rodriguez's use of a turn-off transistor to discharge the output MOSFET gate-to-source capacitance provides some improvement in turn-off speed, but provides no transient protection to the relay. In a second embodiment disclosed in the Rodriguez patent, an optically coupled JFET switch is used to couple the switched voltage to the gate of the output MOSFET. In so doing, the output MOSFET charges at a faster rate than it normally would. In this set-up, however, the switching JFET suffers from the same draw-backs as the output MOSFET. That is, the JFET has associated with it a charging capacitance which must be overcome. Further, in order for the JFET to switch the current necessary to quickly charge the gate-to-source capacitance of the output MOSFET, the JFET switch must be biased significantly beyond its threshold turn-on voltage. Relays such as this are also vulnerable to transient propagation between the control and switched circuits. Rodriquez also discloses a relay comprising two output transistors connected in parallel with either the source or drain terminals interconnected so that load voltage can be blocked without regard to its polarity. In addition, the gate terminals interconnected so that the gate signal from the photodiode stack is simultaneously applied to the gates and the operation of the two output transistors is concurrent. While operation of the relay is simple, connecting the output transistors in parallel increases the parasitic capacitance of the relay and slows the relays switching speed. Relays with the gate terminals directly interconnected increase the vulnerability of the output MOSFETs to parasitic effects from a gate-to-gate push-pull oscillation condition when performing rapid switching at high currents.

What is desired, therefore, is a solid state relay enabling rapid switching at high power levels.

DETAILED DESCRIPTION OF PREFERRED EMBODIMENTS

A solid state relay provides isolation between a control circuit and a switched circuit and may replace an electromechanical device such as a reed relay. The typical solid state relay comprises at least one semiconductor output device, often a metal oxide semiconductor field effect transistor (MOSFET) that is connected to enable and disable the flow of current to a load in a circuit that is to be switched which is controlled by a signal that is electrically isolated from the signal's source. Very often, the output of a solid state relay comprises a pair of parallel connected output transistors. While a MOSFET transistor can block load voltage in one direction, it can only block about 1 volt in the second direction due to the internal body diode. By interconnecting either the source terminals or the drain terminals of a pair of MOSFET output transistors, one of the transistors body diode will be reversed biased enabling the relay to block the load voltage regardless of its polarity. The gates of the pair of output transistors are also interconnected enabling a single gate signal to be applied simultaneously to both gates triggering simultaneous operation of the pair of output transistors.

Figure 1:
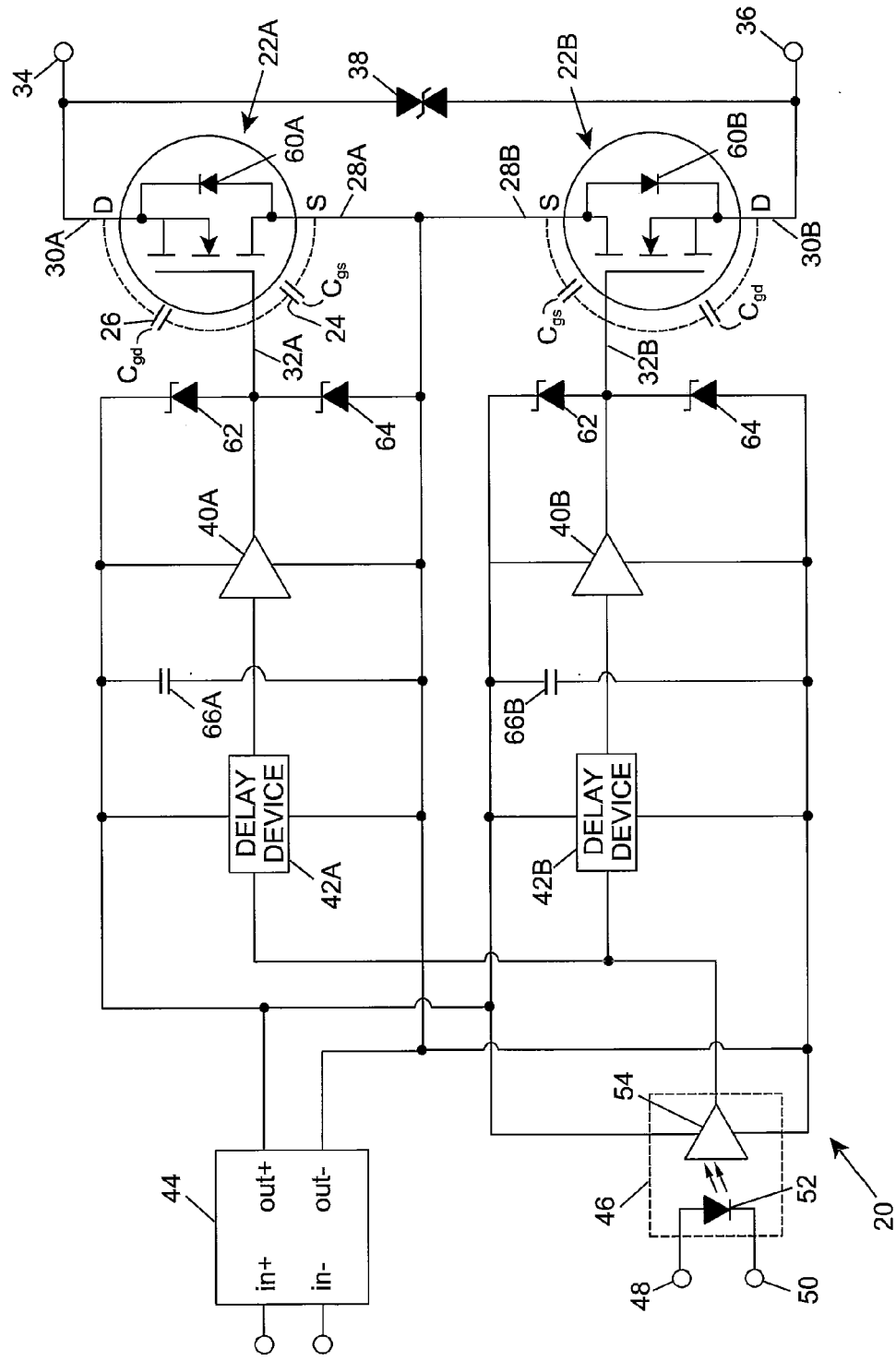
FIG. 1 is a schematic representation of a first embodiment of a high speed solid state relay.

The switching speed of solid state relays is limited, in large part, by an inherent parasitic capacitance of the output transistor(s). This capacitance must be charged before the device begins conducting and must be discharged before conduction will cease. Referring to FIG. 1, for MOSFET transistors used in switching applications, the most important parasitic capacitances are the gate-to-source capacitance ($C_{GS}$) 24 and the gate-to-drain capacitance ($C_{GD}$) 26. The $C_{GS}$ capacitance which is non-linear is the result of an overlap of the source and the channel region of the gate electrode and the $C_{GD}$ capacitance is the result of the capacitance of the depletion region and of an overlap between the junction field effect transistor (JFET) region and the gate electrode. The $C_{GD}$ capacitor is located in a feedback path between the input and output of the device and in switching applications its effective value can be much greater than its nominal capacitance because of a phenomenon known as the "Miller effect." The practical switching time of MOSFET transistors is in the range of approximately 10 nanoseconds (ns) to 60 ns and, typically, the switching time of a power MOSFET is at the upper end of the range because the features of power transistors are larger and the capacitance is greater. Preferably, the switching is 100 ns or less. Having sufficiently high switching speeds decreases the switching losses as a result of the output transistors operating in the switching linear region. When the output stage of the solid state relay comprises a pair of transistors connected in parallel, the parasitic capacitances of the pair of transistors are additive substantially increasing the switching time.

In addition to the parasitic capacitance between the terminals of the output transistor, the switching performance is also affected by inherent parasitic inductance. Source inductance resulting from the source bond wire and printed circuit board wiring inductance between the source lead and the ground slows the flow of current in the source and increases the time required to charge and discharge the input capacitance further delaying turn-on and turn-off. In addition, the source inductance and the input capacitance, the sum of $C_{gs}$ and $C_{gd}$, form a resonant circuit which is excited by steep edges in the gate drive signal waveform and can produce oscillation in the gate circuit. An undesirable push-pull oscillation effect may result from high current turn-off which causes shifting of currents between the gates of the parallel connected transistors. These push-pull oscillation frequencies tend to be centered on the parasitic resonant capacitances and inductances and can be typically in the hundreds of MegaHertz, depending upon the upper speed of the transistors. Drain inductance reduces drain-to-source voltage during turn-on but produces problems during turn-off when the drain current must be reduced quickly.

The inventor concluded that a relay's switching time and/or the minimization of push-pull spurious oscillation susceptibility could be substantially reduced if the gates of the output capacitors were isolated from each other. However, the gates of the pair of output transistors are connected to each other so that the transistors will simultaneously receive the control signal and simultaneously initiate or cease conducting. Separating the gates is problematic because the operating parameters of two seemingly identical transistors can vary substantially. For example, the parasitic capacitance and inductance and the output transistor process variation can vary substantially making the dynamic response of the output transistors to a gate signal difficult to predict. The inventor realized that, while isolating the gates of a pair of output transistors could reduce the time required to switch the relay on or off, rapid and simultaneous switching of the output transistors would require reducing the difference between the dynamic performance of the two transistors resulting from differences in the inherent capacitance and inductance and process variation of the transistors.

Figure 2:
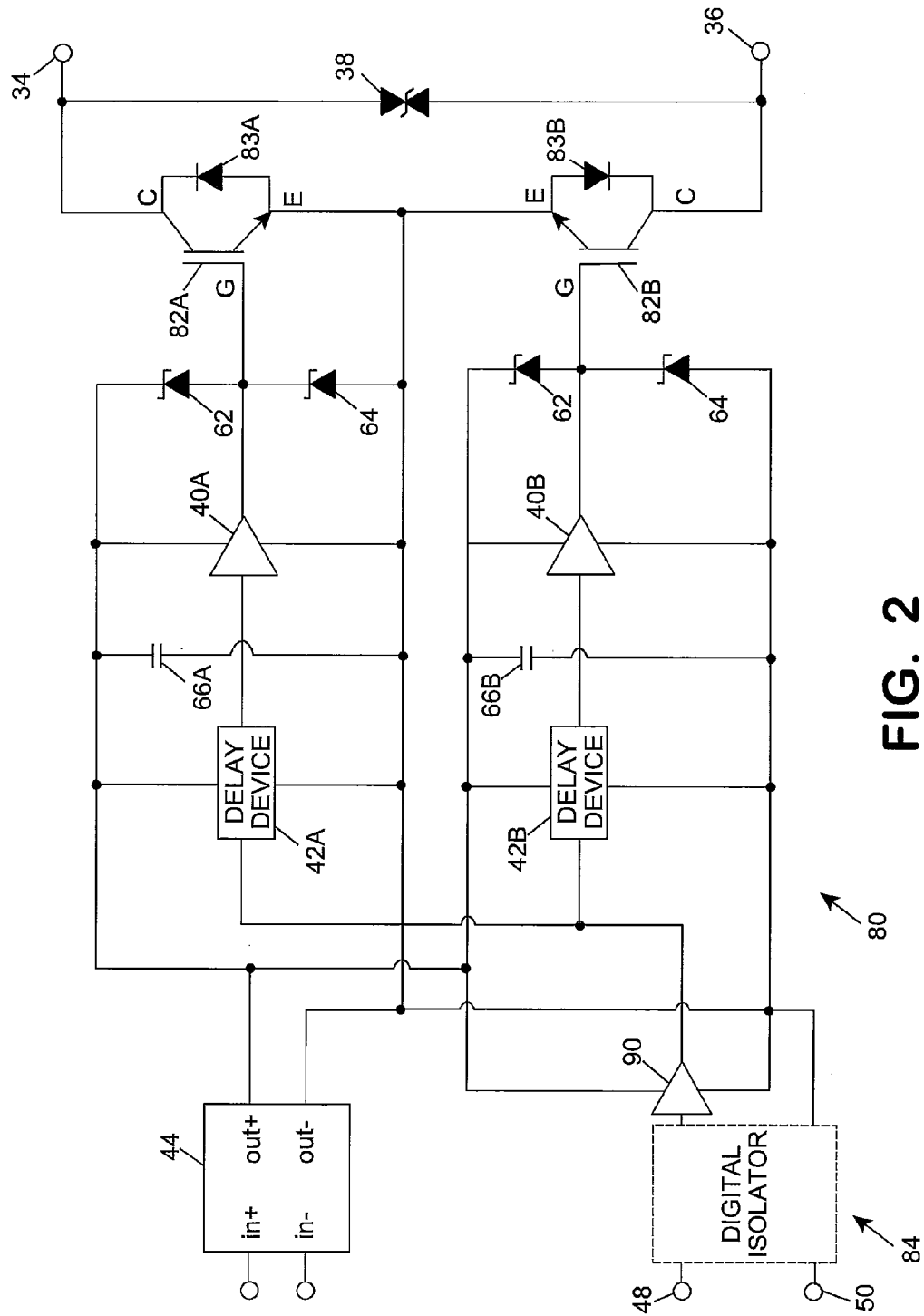
FIG. 2 is a schematic representation of a second embodiment of a high speed solid state relay.

Referring in detail to the drawings where similar parts are identified by like reference numerals, and, more particularly to FIG. 1, a solid state relay 20 includes a pair of three-terminal semiconductor output devices 22A, 22B. Referring also to FIG. 2, while other types of devices, such insulated-gate bipolar transistors (IGBTs) 82A, 82B could be utilized as output devices of a solid state relay 80, MOSFET transistors, as illustrated in FIG. 1, are commonly utilized as the output devices of solid state relays. The source terminals 28A, 28B of the output transistors are interconnected and the drain terminals 30A, 30B of the transistors comprise the output terminals 34, 36 of the relay which are connectable to a circuit (not shown) that is to be switched. The impedance between the source and drain terminals of the respective output transistors 22A, 22B is substantially reduced; that is, the transistors conduct, when a potential, a gate signal, is applied to the respective gate terminals 32A, 32B of the transistors. Likewise, when the gate signals are removed from the gate terminals, the impedance between the drain and source terminals substantially increases and conduction ceases. Since the source terminals of the two output transistors are interconnected, one of the transistors internal body diode is reverse biased regardless of the polarity at the output terminals 34, 36 enabling the relay to block load voltage regardless of its polarity. A Bi-Directional Transient Voltage Suppressor (TVS) 38 limits the voltage between the output terminals to protect the relay and the switched circuit from transient voltage excursions produced by switching.

The IGBTs 82A, 82B preferably include an internal protection diode, in addition to a respective external diode 83A, 83B. The internal protection diode is not intended to take on the full on current of the IGBT, but only a lesser amount due to the duty cycle they are on to suppress reverse voltage transients for IGBT protection.

A gate driver 40A, 40B is connected, respectively, to each of the gate terminals 32A, 32B of the two output transistors 22A, 22B. The gate drivers produce a gate signal at the gate terminals of the respective output transistors in response to gate drive input signals transmitted by respective delay devices 42A, 42B. The gate drivers electrically isolate the respective gate terminals from each other and amplify the gate driver input signal from the delay devices 42A, 42B. The gate drivers are active devices powered by an isolated relay power supply 44 and preferably have a low impedance enabling high currents to be switched rapidly to charge and discharge the parasitic capacitances of the output transistors. Preferably, the inductance of the gate drivers is 20 nH or less and, more preferably, the inductance is 10 nH or less.

The delay devices 42A, 42B are conductively connected to the output of an optical isolator 46 that electrically isolates the relay from a source (not shown) of a control signal. When the control signal is applied to the relay's input terminals 48, 50, light is emitted by a light emitting element 52, typically a light emitting diode (LED). The emitted light impinges on a photovoltaic device 54 producing a voltage, the isolator signal, which is, preferably, amplified by the active photovoltaic device powered by the relay power supply. The isolator signal is conducted to the pair of delay devices 42A, 42B which are connected in parallel to the isolator. When the control signal is removed from the input terminals, the emission of light ceases as does the isolator signal output by the photovoltaic device 54.

Electrical isolation of the gates of the output transistors avoids potential resonance in the gate circuits of the relay. While FIG. 1, illustrates a relay having an optical isolator, the relay could incorporate other types of isolation, for example, a digital isolator 84 as illustrated in FIG. 2. The digital isolator includes input terminals 48, 50 which is preferably connected to an amplifier 90 powered by the relay power supply 44. The input power supply to the digital isolator input side for input terminals 48, 50 is not shown. Switching on or off a voltage in the control signal applied to the input terminals 48, 50 will produce a corresponding on or off voltage at the output. The digital isolator is preferably a high speed digital isolator which tends to have reduced jitter.

The delay devices 42A, 42B are electronically connected to the respective gate drivers and transmit a gate driver input signal to the respective gate driver in response to the isolator signal. The delay device is preferably a silicon delay line with programmable timing delay selectivity from separate serial or parallel activated input signals. The delay device enables the transmission of the gate driver input signal to be temporally delayed for an interval following assertion of the isolator signal at the input of the delay device. By adjusting the delay interval, the timing of the application of the gate signals to the gates of the two output transistors can be temporally offset to allow for varying dynamic response in the gate circuits and output transistors. Also, by adjusting the delay differences in the characteristics of the gate drivers 40A, 40B can be compensated for. In addition, by adjusting the delay, differences in the optical isolators 120A, 120B can be compensated for.

With many paralleled output devices across the output terminals 34, 36, (or 108, 110), the delay may be adjusted so that the signals are all reaching the output devices at substantially the same time. Simultaneous turn-on and turn-off by the output transistors avoids a flow of energy through the internal diodes 60A, 60B connecting the respective sources and drains of the output transistors. Preferably, adjustment of the delay time enables the two output transistors to turn on and off within an interval of approximately 30 ns and, more preferably, within an interval of 0.5 ns. By isolating the gates of the output transistors, relay switching times approaching the inherent switching times of the output transistors can be achieved and oscillation at the gate terminals of the output transistors can be avoided.

Schottky diodes 62, 64 between the gate terminal and the positive and negative outputs of the relay power supply limit the voltage at the gates keep the gate signals within the desired range and protect the gate drivers from parasitic transient voltage coupling from the output transistors during high current switching. Schottky diodes tends to have a swift clamping effect to the power rails with a lower voltage turn-on threshold than the electrostatic discharge (ESD) protection diode in the output circuit of the gate driver. Smoothing capacitors 66 between the positive and negative output of the relay power supply regulate DC voltage variations. Preferably, the capacitors 66 have a capacitance of at least 5 times, more preferably 10 times, greater than the total of the input capacitance and dynamic switching capacitance of the output transistor. This difference in charge provides the dynamic current source for the gate driver for faster gate driver output switching which reduces the switching time of the output transistors.

Figure 3:
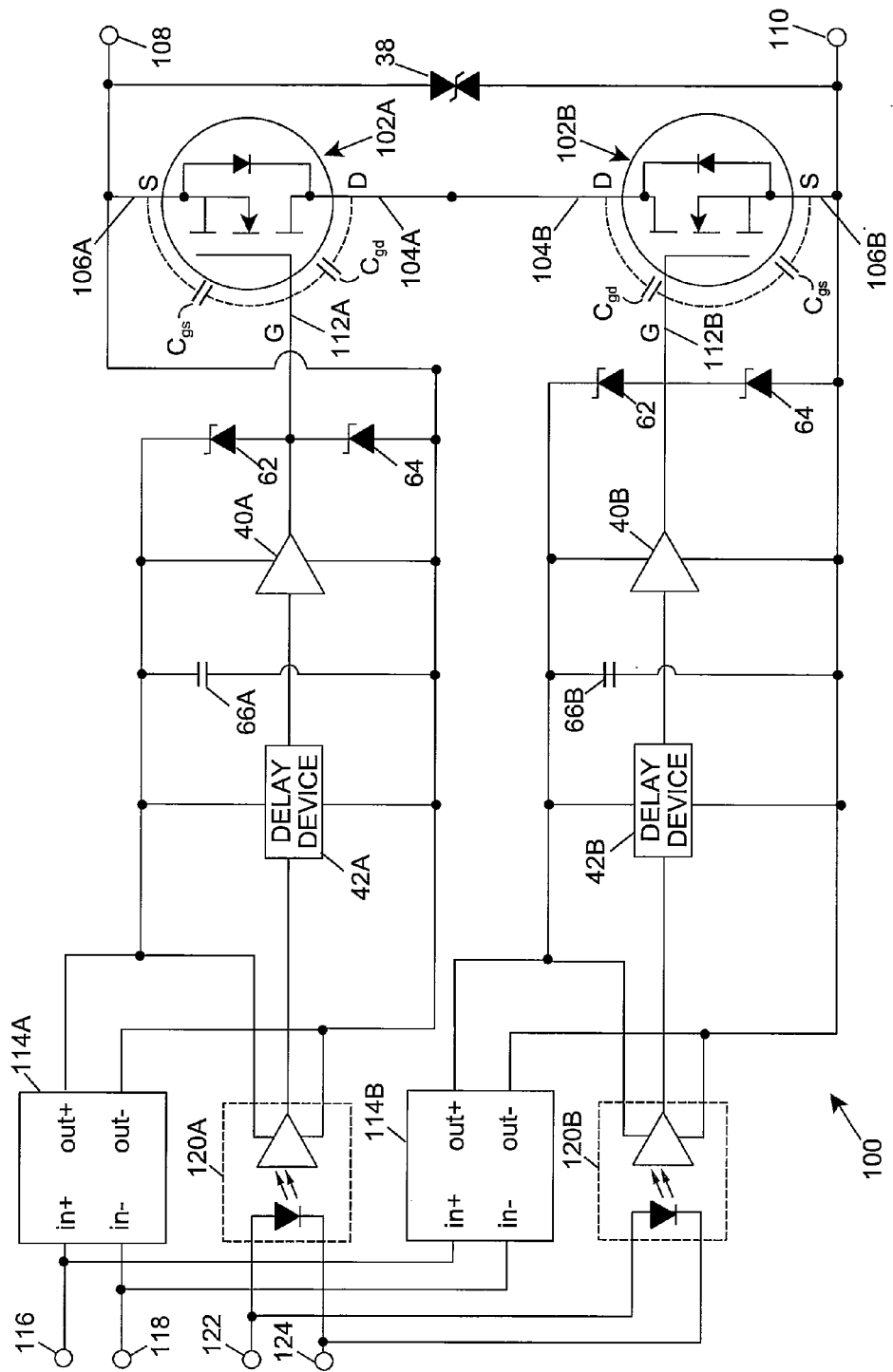
FIG. 3 is a schematic representation of a third embodiment of a high speed solid state relay.

Referring to FIG. 3, in a third embodiment of the solid state relay 100 the drains 104A, 104B of the output transistors 102A, 102B are interconnected and the source terminals 106A, 106B of the output transistors comprise the relay's output terminals 108, 110 connectable to a circuit that is to be switched. The gate terminal 112A, 112B of each of the transistors is connected to an active device driver 40A, 40B which is powered by one of a pair of relay power sources 114A, 114B. The isolated relay power sources are connected to common relay power terminals 116, 118.

The gate driver input signals to the respective gate drivers 40A, 40B are transmitted by respective delay devices 42A, 42B that enable the transmission of the respective gate driver input signals to the respective gate drivers to be temporally delayed following assertion of an isolator signal at the input to the delay device. Optical isolators 120A, 120B connected in parallel produce the isolator signals that are transmitted to the respective delay device 42A, 42B in response to a control signal asserted by the relay's control signal input terminals 122, 124. Smoothing capacitors 66A, 66B connect the positive and negative outputs of the relay power supplies and Schottky diodes 62, 64 connect the respective gate terminals of the output transistors to the positive and negative terminals of the respective relay power supply.

Providing a time delay in the gate circuits of a solid state relay's output transistors enables tuning of the gate circuits for simultaneous operation of a pair of output transistors with electrically isolated gate terminals. Isolating the gate terminals avoids oscillation of the gate signal and reduces the interval between changes in the state of the relay for a high speed, high power solid state relay.

In some cases the optical isolators 120A, 120B may each drive a plurality of parallel circuits. This facilitates providing high currents to the load. Also, a microcontroller may be used to dynamically adjust the delay of the delay devices based upon sensor feedback, such as thermal heating of the output devices or current sensors.

The design preferably includes a single driver circuit 40 together with a single output driver 22. The one-to-one relationship reduces a potential push-pull effect that is present with parallel commonly connected together input gates with multiple parallel output drivers. This push-pull effect may otherwise result in spurious oscillations when switching high currents.

As illustrated, the design permits the output terminals to have different voltage polarities with respect to each other while the circuit remains operational as a relay. This avoids cases where the polarity may prevent the ability of the circuit to turn off. Further, the output terminals may operate at less than 100 volts, but are not limited to.

The detailed description, above, sets forth numerous specific details to provide a thorough understanding of the present invention. However, those skilled in the art will appreciate that the present invention may be practiced without these specific details. In other instances, well known methods, procedures, components, and circuitry have not been described in detail to avoid obscuring the present invention.

Preferably, the gate driver is provided a substantially constant signal from the signal source that can maintain a constant DC or close to DC on or off state for extended time periods. Thus this reduces potential saturation in the signal source.

All the references cited herein are incorporated by reference.

The terms and expressions that have been employed in the foregoing specification are used as terms of description and not of limitation, and there is no intention, in the use of such terms and expressions, of excluding equivalents of the features shown and described or portions thereof, it being recognized that the scope of the invention is defined and limited only by the claims that follow.

I claim:
1. A solid state relay comprising:
(a) a first semiconductor device including a first terminal, a second terminal arranged for conductive connection to a load and a third terminal, an impedance between said first terminal and said second terminal substantially reduced by application of a first gate potential to said third terminal;
(b) a first gate driver conductively connected to said third terminal and arranged to transmit said first gate potential to said third terminal in response to a first gate driver input;
(c) a first delay device arranged to transmit said first gate driver input to said first gate driver in response to an isolator signal and to temporally delay said transmission;
(d) a second semiconductor device including a fourth terminal conductively interconnected with said first terminal of said first device, a fifth terminal arranged for conductive connection to said load and a sixth terminal, an impedance between said fourth terminal and said fifth terminal substantially reduced by application of a second gate potential to said sixth terminal;
(e) a second gate driver conductively connected to said sixth terminal and arranged to transmit said second gate potential to said sixth terminal in response to a second gate driver input; and

(f) a second delay device arranged to transmit said second gate driver input to said second gate driver in response to said isolator signal and to temporally delay said transmission;

(g) wherein at least one of said second terminal and said fifth terminal have modified voltages based upon at least one of said first gate potential and said second gate potential;

(h) an isolator outputting said isolator signal in response to a control signal.

2. The relay of claim 1 wherein said isolator is an optical isolator having an output connected to transmit said isolator signal to said first delay device and said second delay device.

3. The relay of claim 1 wherein said isolator is a digital isolator.

4. A solid state relay comprising:

(a) a first semiconductor device including a first terminal, a second terminal arranged for conductive connection to a load and a third terminal, an impedance between said first terminal and said second terminal substantially reduced by application of a first gate potential to said third terminal;

(b) a first gate driver conductively connected to said third terminal and arranged to transmit said first gate potential to said third terminal in response to a first gate driver input;

(c) a first delay device arranged to transmit said first gate driver input to said first gate driver in response to an isolator signal and to temporally delay said transmission;

(d) a second semiconductor device including a fourth terminal conductively interconnected with said first terminal of said first device, a fifth terminal arranged for conductive connection to said load and a sixth terminal, an impedance between said fourth terminal and said fifth terminal substantially reduced by application of a second gate potential to said sixth terminal;

(e) a second gate driver conductively connected to said sixth terminal and arranged to transmit said second gate potential to said sixth terminal in response to a second gate driver input; and (f) a second delay device arranged to transmit said second gate driver input to said second gate driver in response to said isolator signal and to temporally delay said transmission;

(g) wherein at least one of said second terminal and said fifth terminal have modified voltages based upon at least one of said first gate potential and said second gate potential;

(h) wherein said first semiconductor device is a first metal oxide field effect transistor;

(i) wherein the first terminal is a source terminal of said first metal oxide semiconductor field effect transistor and said fourth terminal is a source terminal of a second metal oxide semiconductor field effect transistor.

5. A solid state relay comprising:

(a) a first semiconductor device including a first terminal, a second terminal arranged for conductive connection to a load and a third terminal, an impedance between said first terminal and said second terminal substantially reduced by application of a first gate potential to said third terminal;

(b) a first gate driver conductively connected to said third terminal and arranged to transmit said first gate potential to said third terminal in response to a first gate driver input;

(c) a first delay device arranged to transmit said first gate driver input to said first gate driver in response to an isolator signal and to temporally delay said transmission;

(d) a second semiconductor device including a fourth terminal conductively interconnected with said first terminal of said first device, a fifth terminal arranged for conductive connection to said load and a sixth terminal, an impedance between said fourth terminal and said fifth terminal substantially reduced by application of a second gate potential to said sixth terminal;

(e) a second gate driver conductively connected to said sixth terminal and arranged to transmit said second gate potential to said sixth terminal in response to a second gate driver input; and (f) a second delay device arranged to transmit said second gate driver input to said second gate driver in response to said isolator signal and to temporally delay said transmission;

(g) wherein at least one of said second terminal and said fifth terminal have modified voltages based upon at least one of said first gate potential and said second gate potential;

(h) wherein said first gate driver is an active device powered by an isolated relay power source.

6. A solid state relay comprising:

(a) a first semiconductor device including a first terminal, a second terminal arranged for conductive connection to a load and a third terminal, an impedance between said first terminal and said second terminal substantially reduced by application of a first gate potential to said third terminal;

(b) a first gate driver conductively connected to said third terminal and arranged to transmit said first gate potential to said third terminal in response to a first gate driver input;

(c) a first delay device arranged to transmit said first gate driver input to said first gate driver in response to a first isolator signal and to temporally delay said transmission;

(d) a first isolator connected to a source of a control signal and arranged to transmit said first isolator signal to said first delay device in response to a control signal;

(e) a second semiconductor device including a fourth terminal conductively interconnected with said first terminal of said first device, a fifth terminal arranged for conductive connection to said load and a sixth terminal, an impedance between said fourth terminal and said fifth terminal substantially reduced by application of a second gate potential to said sixth terminal;

(f) a second gate driver conductively connected to said sixth terminal and arranged to transmit said second gate potential to said sixth terminal in response to a second gate driver input;

(g) a second delay device arranged to transmit said second gate driver input to said second gate driver in response to a second isolator signal and to temporally delay said transmission;

(h) a second isolator connected to said source of said control signal and arranged to transmit said second isolator signal to said second delay device in response to said control signal;

(g) wherein at least one of said second terminal and said fifth terminal have modified voltages based upon at least one of said first gate potential and said second gate potential.

7. The relay of claim 6 wherein said first isolator is a digital isolator having an output connected to transmit said first isolator signal to said first delay device.

8. The relay of claim 6 wherein said first isolator is a digital isolator.

9. The relay of claim 6 wherein said first semiconductor device is a first metal oxide field effect transistor.

10. The relay of claim 9 wherein the first terminal is a drain terminal of said first metal oxide semiconductor field effect transistor and said fourth terminal is a drain terminal of a second metal oxide semiconductor field effect transistor.

11. The relay of claim 6 wherein said first semiconductor device is an insulated gate bipolar transistor.

12. The relay of claim 6 wherein said first gate driver is an active device powered by an isolated relay power source.

13. A solid state relay comprising:
(a) a first semiconductor device including a first terminal, a second terminal arranged for conductive connection to a load and a third terminal, an impedance between said first terminal and said second terminal substantially reduced by application of a first gate potential to said third terminal;
(b) a first gate driver conductively connected to said third terminal and arranged to transmit said first gate potential to said third terminal in response to a first gate driver input;
(c) a first delay device arranged to transmit said first gate driver input to said first gate driver in response to an isolator signal and to temporally delay said transmission;
(d) a second semiconductor device including a fourth terminal conductively interconnected with said first terminal of said first device, a fifth terminal arranged for conductive connection to said load and a sixth terminal, an impedance between said fourth terminal and said fifth terminal substantially reduced by application of a second gate potential to said sixth terminal;
(e) a second gate driver conductively connected to said sixth terminal and arranged to transmit said second gate potential to said sixth terminal in response to a second gate driver input;
(f) a second delay device arranged to transmit said second gate driver input to said second gate driver in response to said isolator signal and to temporally delay said transmission;
(g) wherein said first semiconductor device is a first metal oxide field effect transistor;
(h) wherein the first terminal is a source terminal of said first metal oxide semiconductor field effect transistor and said fourth terminal is a source terminal of a second metal oxide field effect transistor.

14. A solid state relay comprising:
(a) a first semiconductor device including a first terminal, a second terminal arranged for conductive connection to a load and a third terminal, an impedance between said first terminal and said second terminal substantially reduced by application of a first gate potential to said third terminal;
(b) a first gate driver conductively connected to said third terminal and arranged to transmit said first gate potential to said third terminal in response to a first gate driver input;
(c) a first delay device arranged to transmit said first gate driver input to said first gate driver in response to an isolator signal and to temporally delay said transmission;
(d) a second semiconductor device including a fourth terminal conductively interconnected with said first terminal of said first device, a fifth terminal arranged for conductive connection to said load and a sixth terminal, an impedance between said fourth terminal and said fifth terminal substantially reduced by application of a second gate potential to said sixth terminal;
(e) a second gate driver conductively connected to said sixth terminal and arranged to transmit said second gate potential to said sixth terminal in response to a second gate driver input;
(f) a second delay device arranged to transmit said second gate driver input to said second gate driver in response to said isolator signal and to temporally delay said transmission;
(g) wherein said first gate driver is an active device powered by an isolated relay power source and said second date driver is an active device powered by an isolated relay power source, wherein said first gate driver and said second gate driver are isolated from one another.

15. A solid state relay comprising:
(a) a first semiconductor device including a first terminal, a second terminal arranged for conductive connection to a load and a third terminal, an impedance between said first terminal and said second terminal substantially reduced by application of a first gate potential to said third terminal;
(b) a first gate driver conductively connected to said third terminal and arranged to transmit said first gate potential to said third terminal in response to a first gate driver input;
(c) a first delay device arranged to transmit said first gate driver input to said first gate driver in response to an isolator signal and to temporally delay said transmission;
(d) a second semiconductor device including a fourth terminal conductively interconnected with said first terminal of said first device, a fifth terminal arranged for conductive connection to said load and a sixth terminal, an impedance between said fourth terminal and said fifth terminal substantially reduced by application of a second gate potential to said sixth terminal;
(e) a second gate driver conductively connected to said sixth terminal and arranged to transmit said second gate potential to said sixth terminal in response to a second gate driver input;
(f) a second delay device arranged to transmit said second gate driver input to said second gate driver in response to said isolator signal and to temporally delay said transmission;
(g) an isolator outputting said isolator signal to said first delay device in response to a control signal where a ground reference of said control signal is isolated from said isolator signal.

16. The relay of claim 15 wherein said isolator is a digital isolator.

17. A solid state relay comprising:
(a) a first semiconductor device including a first terminal, a second terminal arranged for conductive connection to a load and a third terminal, an impedance between said first terminal and said second terminal substantially reduced by application of a first gate potential to said third terminal;
(b) a first gate driver conductively connected to said third terminal and arranged to transmit said first gate potential to said third terminal in response to a first gate driver input;

(c) a first delay device arranged to transmit said first gate driver input to said first gate driver in response to an isolator signal and to temporally delay said transmission;

(d) a second semiconductor device including a fourth terminal conductively interconnected with said first terminal of said first device, a fifth terminal arranged for conductive connection to said load and a sixth terminal, an impedance between said fourth terminal and said fifth terminal substantially reduced by application of a second gate potential to said sixth terminal;

(e) a second gate driver conductively connected to said sixth terminal and arranged to transmit said second gate potential to said sixth terminal in response to a second gate driver input;

(f) a second delay device arranged to transmit said second gate driver input to said second gate driver in response to said isolator signal and to temporally delay said transmission;

(g) wherein said first delay device has a programmable delay.

18. A solid state relay comprising:

(a) a first semiconductor device including a first terminal, a second terminal arranged for conductive connection to a load and a third terminal, an impedance between said first terminal and said second terminal substantially reduced by application of a first gate potential to said third terminal;

(b) a first gate driver conductively connected to said third terminal and arranged to transmit said first gate potential to said third terminal in response to a first gate driver input;

(c) a first delay device arranged to transmit said first gate driver input to said first gate driver in response to an isolator signal and to temporally delay said transmission;

(d) a second semiconductor device including a fourth terminal conductively interconnected with said first terminal of said first device, a fifth terminal arranged for conductive connection to said load and a sixth terminal, an impedance between said fourth terminal and said fifth terminal substantially reduced by application of a second gate potential to said sixth terminal;

(e) a second gate driver conductively connected to said sixth terminal and arranged to transmit said second gate potential to said sixth terminal in response to a second gate driver input;

(f) a second delay device arranged to transmit said second gate driver input to said second gate driver in response to said isolator signal and to temporally delay said transmission;

(g) an isolator outputting said isolator signal in response to a control signal;

(h) said isolator is an optical isolator having an output connected to transmit said isolator signal to said first delay device and said second delay device.

19. A solid state relay comprising:

(a) a first semiconductor device including a first terminal, a second terminal arranged for conductive connection to a load and a third terminal, an impedance between said first terminal and said second terminal substantially reduced by application of a first gate potential to said third terminal;

(b) a first gate driver conductively connected to said third terminal and arranged to transmit said first gate potential to said third terminal in response to a first gate driver input;

(c) a first delay device arranged to transmit said first gate driver input to said first gate driver in response to an isolator signal and to temporally delay said transmission;

(d) a second semiconductor device including a fourth terminal conductively interconnected with said first terminal of said first device, a fifth terminal arranged for conductive connection to said load and a sixth terminal, an impedance between said fourth terminal and said fifth terminal substantially reduced by application of a second gate potential to said sixth terminal;

(e) a second gate driver conductively connected to said sixth terminal and arranged to transmit said second gate potential to said sixth terminal in response to a second gate driver input;

(f) a second delay device arranged to transmit said second gate driver input to said second gate driver in response to said isolator signal and to temporally delay said transmission;

(g) wherein the first gate driver is an active device powered by an isolated relay power source and the second gate driver is an active device powered by an isolated relay power source, where each of said isolated relay power sources are isolated from said second terminal and said fifth terminal.

* * * * *